United States Patent
Wu

[11] Patent Number: 6,133,102
[45] Date of Patent: Oct. 17, 2000

[54] METHOD OF FABRICATING DOUBLE POLY-GATE HIGH DENSITY MULTI-STATE FLAT MASK ROM CELLS

[76] Inventor: Shye-Lin Wu, No.6, Creation Rd.2, Science-Based Industrial Park, Hsinchu, Taiwan

[21] Appl. No.: 09/099,699

[22] Filed: Jun. 19, 1998

[51] Int. Cl.[7] .................................................. H01L 21/336
[52] U.S. Cl. .......................................... 438/276; 438/278
[58] Field of Search .................................... 438/276, 278, 438/527, 217, 290, FOR 187, FOR 163, FOR 191, FOR 212, FOR 217; 257/365, 392

[56] References Cited

U.S. PATENT DOCUMENTS

| | | | |
|---|---|---|---|
| 5,449,632 | 9/1995 | Hong | 437/48 |
| 5,536,669 | 7/1996 | Su et al. | 437/48 |
| 5,556,800 | 9/1996 | Takizawa et al. | |
| 5,585,297 | 12/1996 | Sheng et al. | |
| 5,661,326 | 8/1997 | Hong | 257/402 |
| 5,683,925 | 11/1997 | Irani et al. | |
| 5,891,779 | 4/1999 | Chung et al. | 438/276 |

OTHER PUBLICATIONS

Ong et al., CVD $SiN_x$ Anti-reflective Coating for Sub–0.5μm Lithography, 1995 Symposium on VLSI Technology Digest of Technical Papers, Apr. 1995, pp. 73 and 74.
Bertagnolli et al., ROS: An Extremely High Density Mask ROM Technology Based On Vertical Transistor Cells, 1996 Symposium on VLSI Technology Digest of Technical Papers, pp. 58 and 59.

*Primary Examiner*—George Fourson
*Assistant Examiner*—Elizabeth Abbott
*Attorney, Agent, or Firm*—Harness, Dickey & Pierce, P.L.C.

[57] ABSTRACT

A method to fabricate double poly gate high-density multi-state flat mask ROM cells on a silcon substrate is disclosed. The method comprises the following steps. Firstly, an in-situ n+ first polysilicon/pad oxide layer is deposited on the silicon substrate, and then an ARC layer such as nitride layer is deposited to improve the resolution during the lithography process for pateterning a first formed word line. After forming a plurality of dual nitride spacers on sidewalls of the first patterned gate, a first photoresist coating on all resultant surfaces except the two predetermined regins, a first boron or $BF_2^+$ coding implant into the silicon substrate is carried out. The photoresist is then stripped and an oxidaiton process conducted in $O_2$ ambient to grow oxide layers on all surfaces of the silicon substrate using the nitride layer as a hard mask. Subsequently, a second silicon layer (polysilicon or amorphous silicon) is deposited to refill all of the spaces between the two nearest first formed gates, and then a thick oxide layer is formed on the second polysilicon layer. After that, a CMP process is done to form a flat surface using the nitride as an etching stopper. Finally, a second photoresist mask is formed on all surfaces except a second predetermined region. Then a high energy, second boron coding implant is implanted into said predetermined regions to form the multi-state mask ROM.

13 Claims, 6 Drawing Sheets

METHOD OF FABRICATING DOUBLE POLY-GATE HIGH DENSITY MULTI-STATE FLAT MASK ROM CELLS

FIELD OF THE INVENTION

The present invention relates to a semiconductor device process, and more specifically, to a method of fabricating double poly-gate high-density multi-state flat mask ROM cells.

BACKGROUND OF THE INVENTION

In recent years, the development of portable telecommunication equipment and laptop computers has become a major driving force in the design and technology of the semiconductor IC. One of the most attractive features of the semiconductor IC is a very high-density non-volatile mask ROM. To achieve very high-density mask ROM. a novel semiconductor mask ROM technology incorporating a vertical cell is aiming at this objective and was proposed by Bertagnoili et al. in the reference, B. Bertagnoill et al., "ROS: An Extremely High Density Mask ROM Technology Based On Vertical Transistor Cells", Symp. on VLSI Tech. Dig., p. 58, 1996. The key of this technology is a cell concept based on a vertical MOS transistor in a trench which allows use of the bottom of the trench as an additional self-aligned bit line, and thus doubling the bit line density. This technology enables an approximately twofold packing density compared to conventional planar ROM.

An alternative method to doubling the storage capacity is using a novel multi-state ($\geq 3$ kinds of state) concept. Such a memory cell can double the storage capacitor without Increasing chip area. For example, if memory cells store only data "Q" and "1" states, a more great number of mask ROM cell transistors. should be demanded to provide storage data as compared with that of memory cells which can store four kinds of states, called multiple state mask ROM cells.

Figure 1:
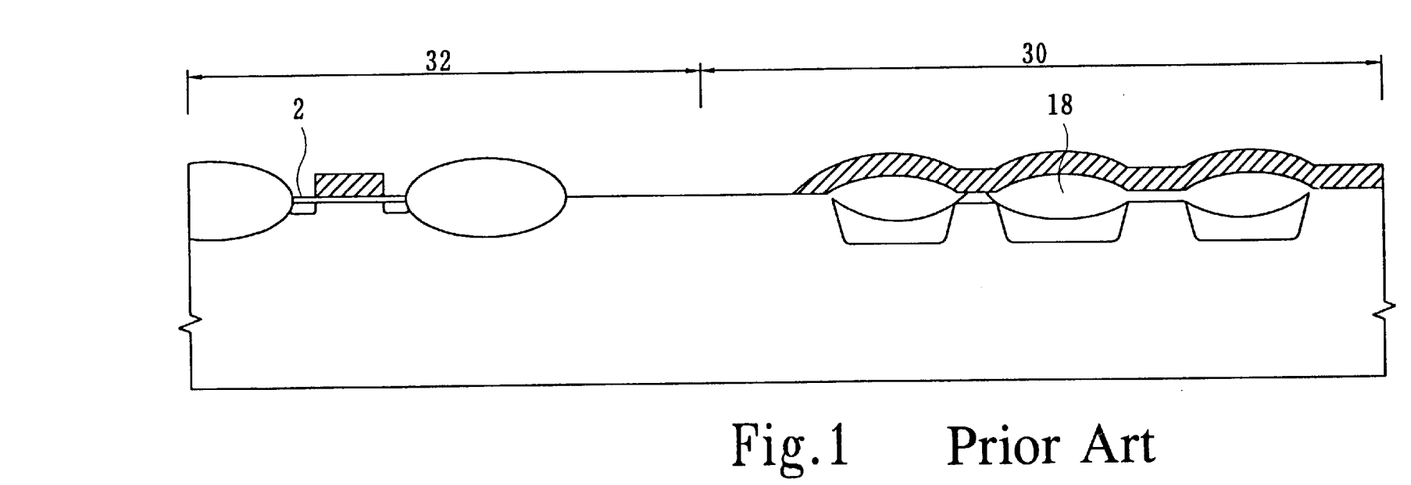
FIG. 1. is a cross-section view of a mask ROM cell array, in accordance with the prior art.

A conventional multi-value ROM stores more than three states, in the manner that changes the threshold, voltage of memory cell transistors given by Sheng et al. in U.S. Patent No. 5,585,297 issued Dec. 17, 1996. A plurality of ion implantation stages using boron ions is performed incorporating a plurality of different mask patterns and different dosage levels. However, the high dose boron coding implant will result in a lower junction breakdown performance of the coded MOSFET and a very high band-to-band leakage current between the adjacent cells as stated in the reference U.S. Patent No. 5,683,925, to Irani et al., issued on Nov. 4, 1997. Hence, Irani et al. in their patent proposed a method for fabricating the mask ROM. In this method, a thick gate oxide layer 18 is thermally grown within a ROM array area 30, even though the gate oxide 2 in the periphery 32 is thinner, as shown in FIG. 1.

An alternative method is proposed by Takiziaws at al. in U.S, Patent No. 5,556,800 issued on Sep. 17, 1996. Takizlawa et al., propose on the contrary, a manner that varies the gate insulating layer's thickness to change the threshold voltage of the channel region. The channel region is divided into dual parts: one divided part having a different gate oxide thickness from the other, and thus a different transitivity for ion implantation. Specifically, the gate electrode has different characteristics of a drain current corresponding to a gate voltage ($I_D$–$V_G$) in the channel regions adjacent to each other.

SUMMARY OF THE INVENTION

The foregoing prior art requires either a gate divided into two portions, which have different gate oxide thickness, or performed multi-implant stages so as to produce a multi-state threshold voltage mask ROM. Hence the processes rather complicated or demonstrate band-to-band leakage problems. The present invention discloses a recipe which combines the concepts of the double the bit line density and multi-state storage way to fabricate double poly gate high density multi-state flat mask ROM cells on a silicon substrate. The method comprises the following step: Firstly, an in-situ n+ first polysilicon (about 50–500 nm) / pad oxide layer (about 3–30 nm) is deposited on the silicon substrate, and then an ARC layer. such as a nitride layer (about 30–100 nm) is deposited to improve the resolution during the lithography process. Subsequently, a CVD nitride deposition and etching back are done to form nitride spacers on sidewalls of the first patterned gate. After coating a first photoresist on all surfaces but expose two predetermined ranges, A first boron or $BF_2^+$coding implant into the coding region is carried out. It is noted that each of the predetermined ranges lies on the surface of the silicon substrate within the interval between the two first formed gates. The photoresist Is then stripped and an oxidation process is conducted in $O_2$ ambient to grow an oxide layer (about 10–50 nm) on all areas using the nitride layer as a hard mask. Subsequently, a second silicon layer (polysilicon or amorphous silicon) is deposited to refill all spaces between the first formed gates, and then a thick oxide layer is formed on the second polysilicon layer to refill a plurality grooves, wherein a plurality grooves lies on the second polysilicon layer. After that, a CMP process is done to form a flat surface using the nitride layer as an etching stopper. Finally, a second photoresist coating on. all surfaces except a predetermined range Is performed. The range includes a surface over two first formed gates and a second formed gate, wherein one of the two first formed gates is implanted previously by the first coding implant. Performing a high energy implantation, a second boron coding implant is implanted into the predetermined regions to form the multi-state mask ROM.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method of fabricating double poly gate high-density flat mask ROM cells to construct multi-state on a silicon substrate is disclosed. The detailed processes are best illustrated by reference to the drawings, and are described as follows.

Figure 2:
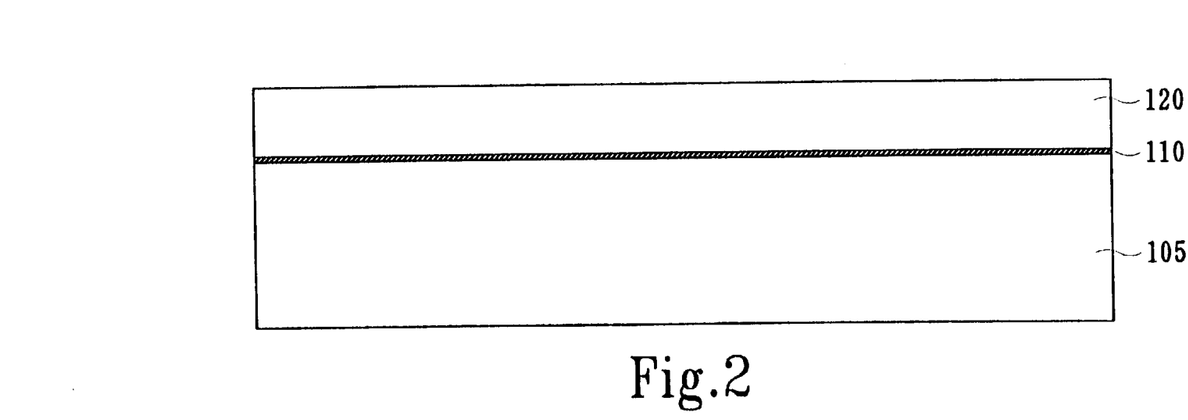
FIG. 2 is a cross-sectional view of formirig a n+-doped polysilicon layer on the pad oxide layer, in accordance with the present invention.

Referring to FIG. 2, an ultra-thin pad oxide layer 110 is formed using a CVD method or a thermal growing method on a silicon substrate 105. The pad oxide 110 thickness is about 3–30 nm. Then a high concentration, In-situ n-type doped polysilicon 120 is deposited o the pad oxide 110. In a preferred embodiment the n-type dopants are phosphorus or arsenic atoms. Preferably, the doping concentration is about $5\times10^{19}$–$5\times10^{21}$/cm$^3$, and the thickness of n+ polysilicon 120 is about 50–500 nm.

Figure 3:
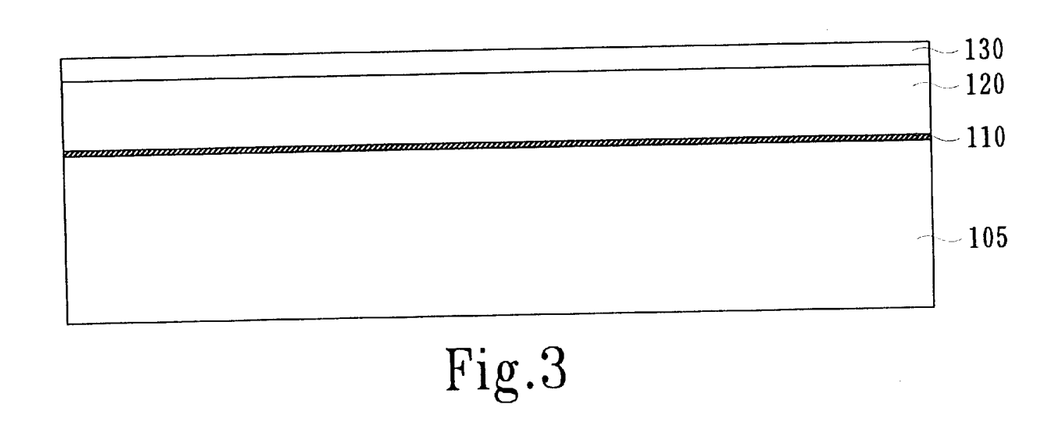
FIG. 3. is a cross-sectional view of deposited a nitride layer on the n+-doped polysilicon layer as an anti-reflection coating layer, in accordance with the present invention.

Referring to FIG. 3, an antireflection coating (ARC) layer such as a thin nitride layer 130 is then deposited on the n+ polysilicon layer 120 to a thickness of about 30–100 nm. The low pressure CVD deposition SiN$_x$ layer on silicon layer for the bottom antireflection coating has been found to be manufacturable for deep U-V and I-line lithography, as is reported by Ong, in the reference, T.P. Ong. et al., "CVD SiNx Anti-Reflection Coating for Sub-0.5 µm Lithography," Symp. On VLSI Tech. Dig., p.73 1995.

Figure 4:
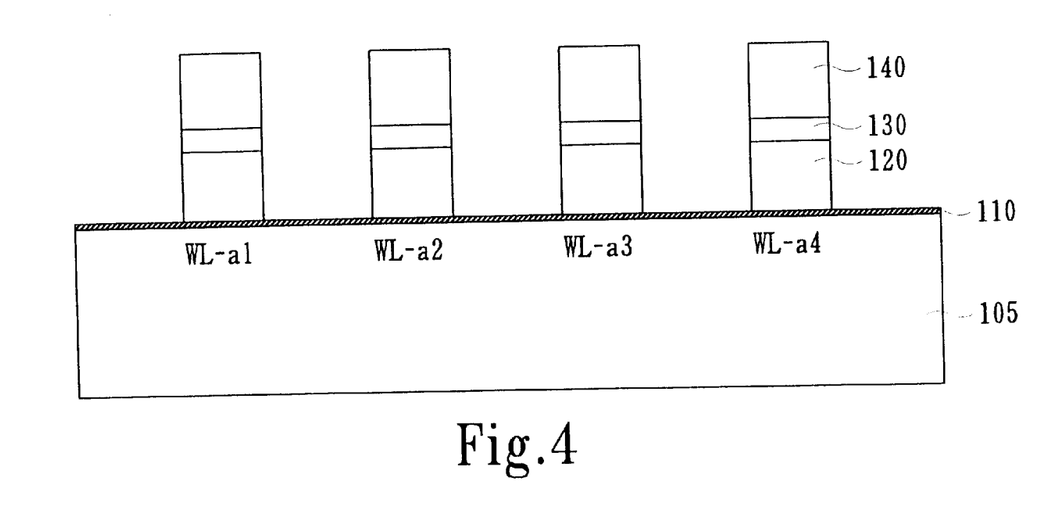
FIG. 4. is a cross-sectional view of patterning the nitride layer, the polysilicon layers and to define a first formed word lines, in accordance with the present invention.

As shown in FIG. 4, a patterned photoresist 140 via conventional lithography technology is masked on the nitride layer 130 (serving as a bottom ARC) to define high density first formed poly-gates as first formed word lines WL-a1, WL-a2, WL-a3 and WL-a4, in a preferred embodiment. Here, the small letters "a" represent "first type." An etching step is subsequently performed. A dry etching using CF$_4$/H$_2$, CH$_3$CHF$_2$, HBrCl$_2$/O$_2$ and SF$_6$ as plasma source or reactive-ion-etching chemistries to remove the nitride layer 130 and the n+ polysilicon layer 120 using the pad oxide layer 110 as etching stopping layer.

Figure 5:
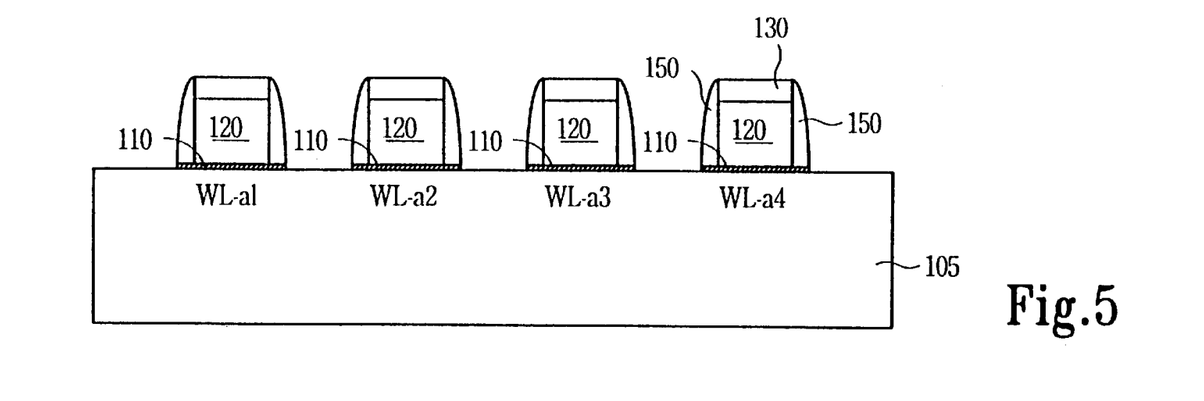
FIG. 5. is a cross-sectional view of etching back the nitride layer to form nitride spacer, In accordance with the present invention.

As shown in FIG. 5, after stripping the photoresist 140, another nitride layer (not shown) is deposited on the resultant surfaces by a CVD process, and then an anisotropic etching (e.g., a dry etching method) is carried out to form a plurality of dual nitride spacers 150. The silicon substrate 105 serves as a stopping layer while proceeding with the etching process. A dipping process using dilute HF or BOE solution is performed to remove remnant pad oxide layer 110 so as to expose the silicon substrate 105. The two-step etching process has the advantages of alleviating the damage and the contaminations on the silicon substrate 105.

Figure 6:
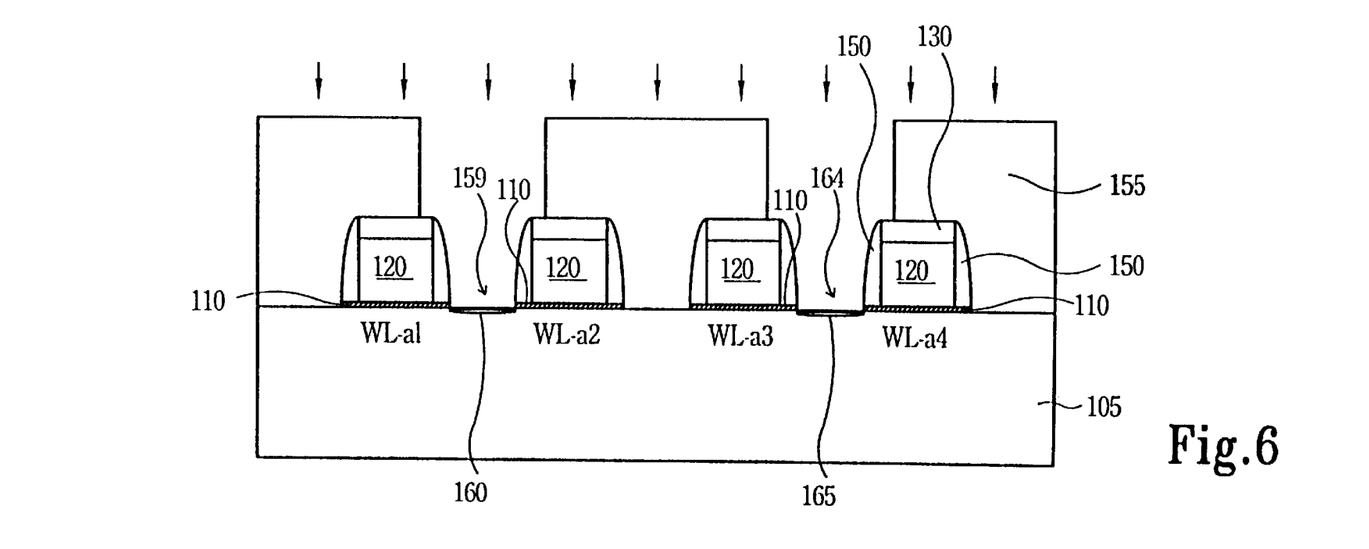
FIG. 6. is a cross-sectional view of performing first coding implant into unmask region to adjust threshold voltage, in accordance with the present invention.

Subsequently, as is shown in FIG. 6, a photoresist 155 is coated on the resultant surface but exposes two predetermined ranges 159 and 164, and then a first coding implant is carried out. In a preferred embodiment, the predetermined ranges 159 and 164 lie in the interval between the nitride spacers 150 of WL-a1 and WL-a2 and between spacers 150 of WL-a3 and WL-a4, respectively. The first coding implant (as indicated by arrows) is performed using p-type ions (such as boron or BF$_2^+$) with an energy and a dosage of about 10–100 keV and of about $5\times10^{11}$–$5\times10^{14}$/cm$^2$, respectively, to form two coding regions 160 and 165 in the silicon substrate 105.

Figure 7:
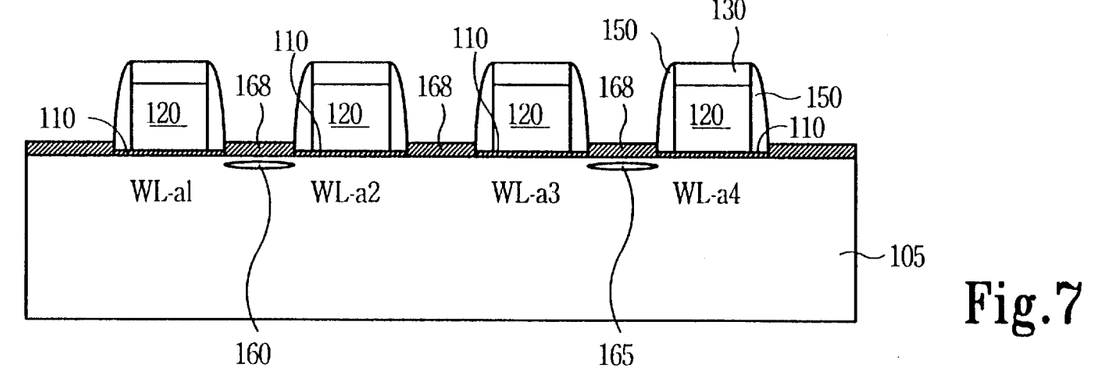
FIG. 7. is a cross-sectional view of performing an oxidation process to grow a thick oxide layer using the nitride spaces as a hard mask, in accordance with the present invention.

Referring to FIG. 7, the photoresist 155 is stripped firstly, and then a thermal oxidation process at a temperature of about 750–1150° C. in O$_2$ ambient is carried out to grow a thicker oxide layer 168 to about 10–50 nm in thickness on all areas using the nitride spacers 150 as a hard mask. The thicker gate oxide layer 168 is for forming a plurality of second formed word lines.

Figure 8:
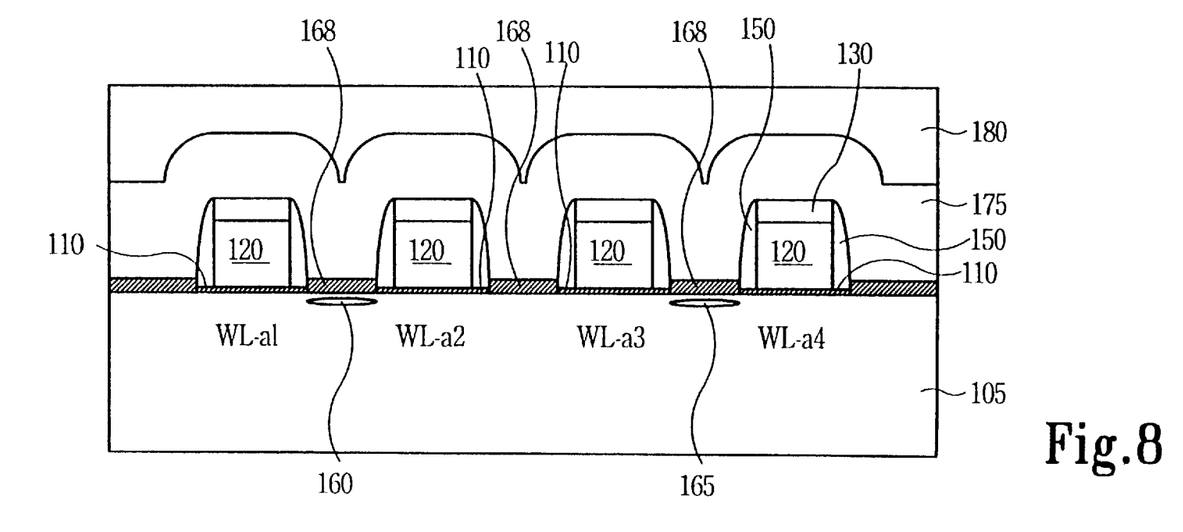
FIG. 8. is a cross-sectional view of refilling all spaces within the first formed gate with n+ doped polysilicon or α-Si, and then a thick CVD oxide film is deposited to refill all grooves on the surface of the second polysilicon layer.

Referring to FIG. 8, an in-situ n-type doped silicon layer 175, such as polysilicon layer or an amorphous silicon (α-Si) layer 175, is deposited to refill all intervals between the nitride spaces 150 of the first formed gates (as indicated by word lines WL-a1, WL-a2 . . . etc.). To deposit the α-Si layer 175, the method such as a LPCVD or a PECVD can be used (operate at temperature about 400–550 or 250–400°C., respectively.) However, to deposit the polysilicon layer 175, a higher temperature process (operate at temperatures of about 560–650° C.) such as a LPCVD is required. The type of silicon layer being selected relies on the interval width (e.g., to refill the interval with 0.1–0.2 µm width, α-Si is prefer, but for 0.25 µm or above, the material can be poly-Si or α-Si). In a preferred embodiment, in-situ phosphorus doped or arsenic doped silicon with the concentrations come up to about $5\times10^{19}$–$5\times10^{21}$/cm$^3$. Thereafter, a thick oxide layer 180 is deposited using a CVD method to refill the spaces between gate structures.

Figure 9:
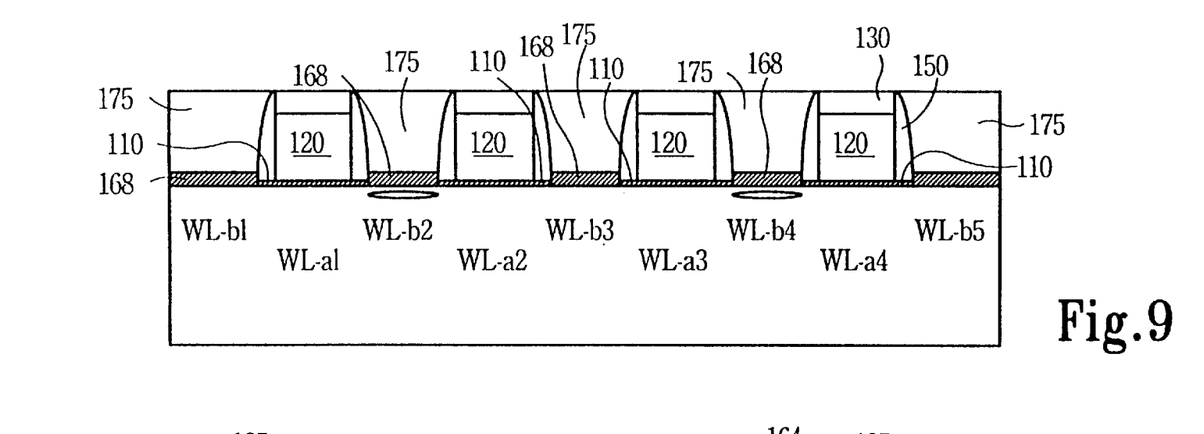
FIG. 9. is a cross-sectional view of performing a planarization process by a CMP process, in accordance with the present invention.

Referring to FIG. 9, a planarization process such as a chemical/mechanical polish (CMP) process using the nitride layer 130 as a CMP stopping layer is achieved to form a flat surface. The n+ doped silicon layer 175 serves as second formed word lines of the mask ROM WL-b1, WL-b2 WL-b3, WL-b4 and WL-b5.

Figure 10:
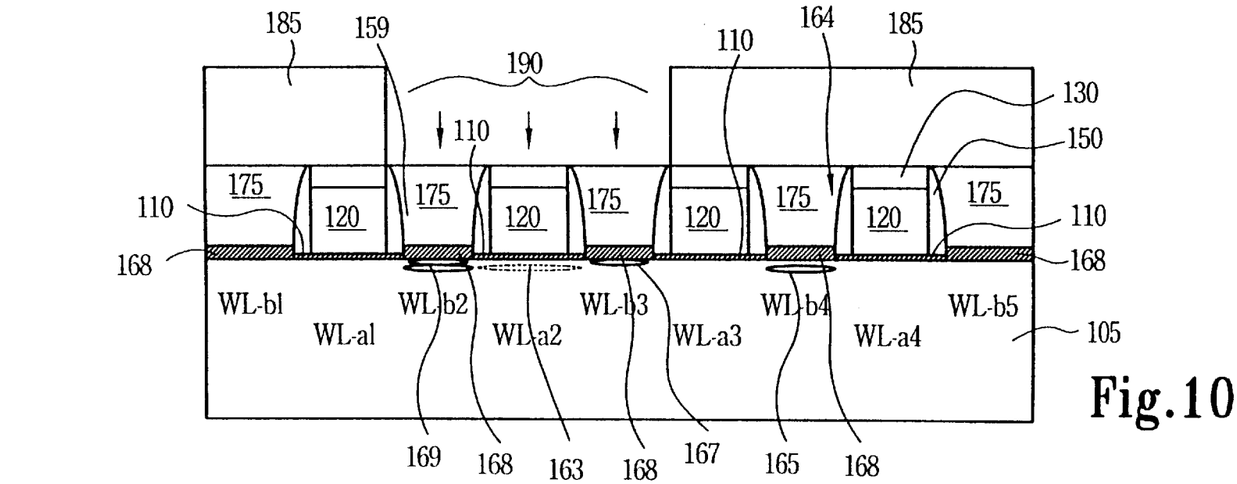
FIG. 10. is a cross-sectional view of performing a second coding implant into the unmask region to do another threshold voltage adjustment, in accordance with the present invention.

Referring to FIG. 10, after the CMP process is completed, a second photoresist 185 is coated on all resulting surfaces except for a predetermined range 190. In a preferred embodiment, the predetermined region 190 includes regions of one of first formed word line WL-a2 and two of second formed word lines WL-b2 and WL-b3. After that, a high energy, second coding implant (as indicated by arrows) using p-type ions is conducted into the silicon substrate to form multi-value threshold voltages of the mask ROM. The p-type ions such as boron ions or BF$_2^+$ ions are preferred using an energy and a dosage of about 60–600 keV and about $5\times10^{11}$–$5\times10^{14}$/cm, respectively, to form three coding regions 169, 163, and 167 on world lines WL-b2, WL-a2, and WL-b3, respectively.

The coding regions label by Vtn3, Vtn4, and Vtn5, and two threshold voltage Vtn1, and Vtn2 are best illustrated in table 1,

TABLE 1

| Label | Thickness type 1 or type 2 | 1st coding implant | 2nd coding implant | Lie on |
|---|---|---|---|---|
| Vtn1 | 1st type gate oxide | No | No | WL-a1,a3,a4 |
| Vtn2 | 2nd type gate oxide | No | No | WL-b1,b5 |
| Vtn3 | 1st type gate oxide | No | Yes | WL-a2 |
| Vtn4 | 2nd type gate oxide | Yes | No | WL-b4 |

TABLE 1-continued

| Label | Thickness type 1 or type 2 | 1st coding implant | 2nd coding implant | Lie on |
|---|---|---|---|---|
| Vtn5 | 2nd type gate oxide | No | Yes | WL-b3 |
| Vtn6 | 2nd type gate oxide | Yes | Yes | WL-b2 |

A comparison of the threshold voltage (Vtn) for various coding processes in

TABLE 2

Figure 11:
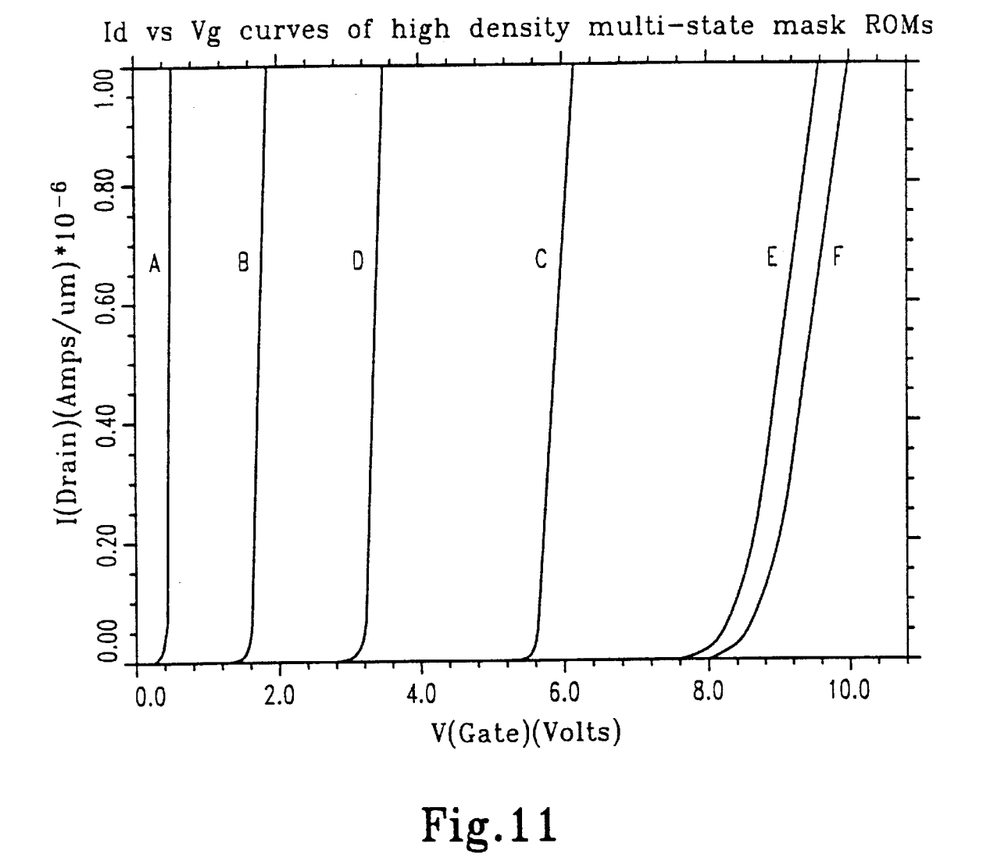
FIG. 11. represents plots of the curves of the drain current ($I_d$) versus the gate voltage ($V_g$) for various mask, ROM coding recipes in accordance with the present invention.

| Sample | Coding Oxide (A) | 1st coding implant $(cm)^{-2}$ | 2nd coding implant $(cm)^{-2}$ | $V_{th}$ (V) |
|---|---|---|---|---|
| A | 140 | No | No | 0.69 |
| B | 386 | No | No | 1.67 |
| C | 386 | $BF_2$-40-1.0B1E13 | No | 5.75 |
| D | 140 | No | B-150-2.0E14 | 3.05 |
| E | 386 | No | B-150-2.0E14 | 7.69 |
| F | 386 | $BF_2$-40-1.0E13 | B-150-2.0E14 | 8.57 | various gate oxide thickness regions is provided by simulation and is shown in table 2. FIG. 11 represents plots of the curves of the drain current ($I_d$) versus the gate voltage ($V_g$) for various mask ROM coding recipes. The plots demonstrate that the values of $V_{th}$ vary significantly with or without first and second coding implant and of gate oxide thickness. Samples A and B represent the regions without any coding implant, the threshold voltage varying with the gate oxide thickness. The string "$BF_2$ 40-1.0E13" in the row of Sample C represents the first coding implant using $BF_2^+$ as ion source, 40 keV in energy and $1.0 \times 10^{13}/cm^2$ in dosage, respectively. Similarity the string "B-150-2.0E14" represents the second coding implant using $B^+$ as ion source, 150 keV in energy and $2.0 \times 10^{14}/cm^2$ in dosage, respectively. It is obvious that there are at least four different threshold voltages (if Vtn>5 V be seen as a "one state") which can be achieved in one mask ROM cell.

The benefits of this invention are: (1) the multi-state mask ROM cells can be easily achieved without penalty of high band-to-band leakage current caused by the high dose boron ion implantation; (2) a high density flat cell can be obtained by using a poly-gate structure; and (3) the proposed recipe is easy for manufacturing.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A method of fabricating double poly gate high density multi-state flat mask ROM cells on a silicon substrate comprising the steps of:

forming a pad oxide layer on said silicon substrate;
forming a first silicon layer on said pad oxide layer;
forming a nitride layer on said first silicon layer;
patterning said nitride layer and said silicon layer to define a plurality of first formed gate regions so as to form first word lines;
forming a plurality of dual nitride spacers on sidewalls of said plurality of first formed gate regions;
etching said pad oxide layer;
coating a first photoresist on portions of surfaces of said nitride layer and said silicon substrate to expose two first predetermined regions, each of said first predetermined regions is within an interval of two nearest said first formed gate regions;
performing a first coding implant using first conductive type dopants into said silicon substrate;
stripping said first photoresist;
performing an oxidation process to grow a first oxide layer on all surfaces of said silicon substrate using said nitride layer as a hard mask forming a second polysilicon layer to refill a intervals between said nitride spacers;
forming a second oxide layer on said second polysilicon layer;
performing a planarization process on said second oxide layer and said second polysilicon layer to form second formed gate regions using said nitride layer of said plurality of said first formed gate regions as an etching stopper;
coating a second photoresist on portions of surfaces of said nitride layer and said second polysilicon layer to expose a second predetermined region, wherein said second predetermined region includes a surface over at least one of first formed gate region and two of second formed gate regions; and
performing a second coding implant using second conductive type dopants into said second predetermined region.

2. The method of claim 1 said pad oxide is about 3–30 nm in thickness.

3. The method of claim 1, wherein said first silicon layer is a polysilicon layer having in-situ n-type doping and having a thickness of about 50–500 nm and to concentrations of about $5 \times 10^{19} - 5 \times 10^{21}/cm^3$.

4. The method of claim 3, wherein said n-type dopants are selected from the group consisting of arsenic and phosphorus.

5. The method of claim 1, wherein said nitride layer is deposited by a LPCVD method to a thickness of about 30–100 nm a temperature of about 600–800° C.

6. The method of claim 1, wherein said forming a plurality of dual nitride spacers comprises the steps of:

performing a CVD nitride layer deposition on resultant surface of said pad oxide layer and said nitride layer after steps of patterning said nitride layer; and
performing anisotropic etching using said silicon substrate as a stopping layer.

7. The method of claim 1, wherein said step of performing a first coding implant is carried out using a species of p-type ions with an energy and a dosage of about 10–100 keV and of about $5 \times 10^{11} - 5 \times 10^{14}/cm^2$, respectively, said p-type ion is selected from the group consisting of boron and $BF_2^+$.

8. The method of claim 1, wherein said step of performing an oxidation is done to grow an oxide layer having a thickness of about 10–50 nm at a temperature of about 750–1150° C.

9. The method of claim 1, wherein said second silicon layer is selected from the group consisting of amorphous silicon and polysilicon layer, said second silicon layer contains n-type dopants to concentrations of about $5 \times 10^{19} - 5 \times 10^{21}/cm^3$.

10. The method of claim 1, wherein said steps of forming second silicon layer is done at a temperature of about 300–650° C.

11. The method of claim 1, wherein said step of performing a planarization process is done by a method comprising a CMP process.

12. The method of claim 1, wherein said one of first formed gate regions in second predetermined region is prior implanted by said first coding implant.

13. The method of claim 1, wherein said step of performing a second coding implant is carried out using a species of p-type ions with an energy and a dosage of about 60–500 keV and of about $5 \times 10^{11}$–$5 \times 10^{14}/cm^2$, respectively, said p-type ion is selected from the group consisting of boron and $BF_2^+$.

* * * * *